United States Patent
Hokazono

(10) Patent No.: US 6,881,633 B2
(45) Date of Patent: Apr. 19, 2005

(54) METHOD OF MANUFACTURING A SEMICONDUCTOR DEVICE WITH AN L-SHAPED/REVERSED L-SHAPED GATE SIDE-WALL INSULATING FILM

(75) Inventor: Akira Hokazono, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/875,310

(22) Filed: Jun. 25, 2004

(65) Prior Publication Data

US 2004/0235229 A1 Nov. 25, 2004

Related U.S. Application Data

(63) Continuation of application No. 10/422,805, filed on Apr. 25, 2003, which is a continuation of application No. 10/020,940, filed on Dec. 19, 2001, now Pat. No. 6,573,583.

(30) Foreign Application Priority Data

Dec. 27, 2000 (JP) ........................................ 2000-397293

(51) Int. Cl.⁷ ............................................. H01L 21/336
(52) U.S. Cl. ...................... 438/285; 438/303; 438/305; 438/595; 257/E21.435; 257/E21.346
(58) Field of Search ................................ 438/303, 305, 438/595; 257/E21.435, E21.346

(56) References Cited

U.S. PATENT DOCUMENTS

| | | |
|---|---|---|
| 4,791,073 A | 12/1988 | Nagy et al. |
| 5,702,986 A | 12/1997 | Mathews et al. ........... 438/163 |
| 5,739,066 A | 4/1998 | Pan ............................ 438/595 |
| 6,137,149 A | 10/2000 | Kodama |
| 6,391,732 B1 * | 5/2002 | Gupta et al. ................ 438/305 |
| 6,479,361 B1 | 11/2002 | Park |
| 6,492,665 B1 | 12/2002 | Akamatsu et al. .......... 257/192 |

FOREIGN PATENT DOCUMENTS

| | | |
|---|---|---|
| JP | 59-58837 | 4/1984 |
| JP | 63-197355 | 8/1988 |
| JP | 1-151245 | 6/1989 |
| JP | 58-143548 | 8/1993 |
| JP | 9-252049 | 9/1997 |
| JP | 10-12879 | 1/1998 |
| JP | 2000-49348 A | 2/2000 |
| JP | 2000-223703 A | 8/2000 |
| JP | 2000-252462 | 9/2000 |
| JP | 2000-269495 | 9/2000 |
| JP | 2000-332099 | 11/2000 |
| KR | 2000-0060649 | 10/2000 |
| KR | 2001-0001735 | 1/2001 |

* cited by examiner

Primary Examiner—David Nelms
Assistant Examiner—Mai-Huong Tran
(74) Attorney, Agent, or Firm—Pillsbury Winthrop LLP

(57) ABSTRACT

Provided is a semiconductor device, comprising a gate electrode formed on a semiconductor substrate, source/drain diffusion layers formed on both sides of the gate electrode, a gate electrode side-wall on the side of the source/drain diffusion layer and a gate side-wall insulating film covering a part of the upper surface of the semiconductor substrate in the vicinity of the gate electrode and having an L-shaped/reversed L-shaped cross-sectional shape, and a semiconductor layer extending over the gate side-wall insulating film covering a part of the upper surface of the semiconductor substrate in the vicinity of the gate electrode.

2 Claims, 4 Drawing Sheets

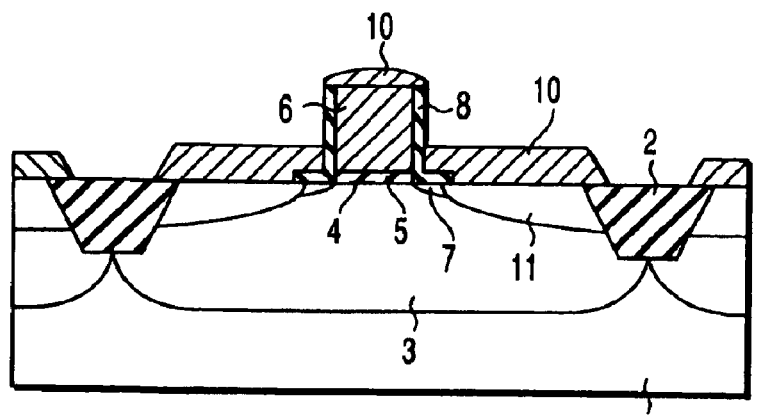
F I G. 3D
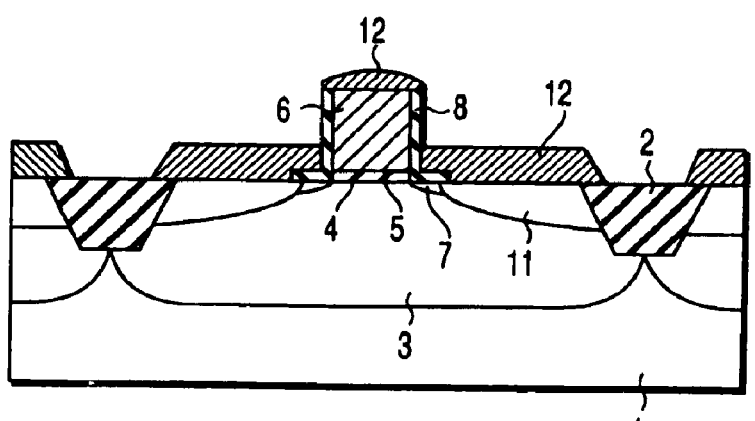
F I G. 3E
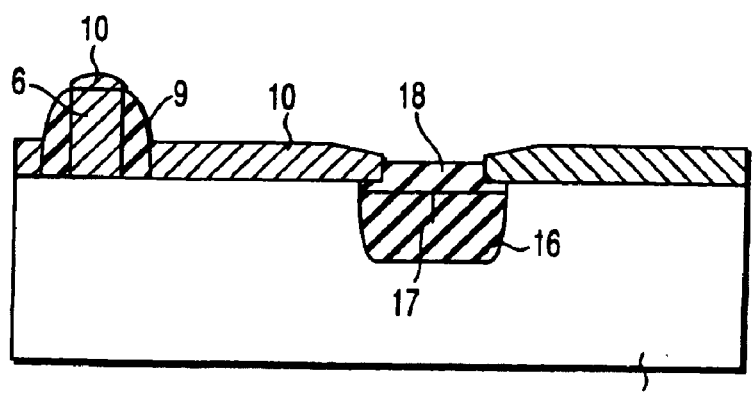
F I G. 4

METHOD OF MANUFACTURING A SEMICONDUCTOR DEVICE WITH AN L-SHAPED/REVERSED L-SHAPED GATE SIDE-WALL INSULATING FILM

CROSS-REFERENCE TO RELATED APPLICATIONS

This is a Continuation Application of U.S. application Ser. No. 10/422,805, filed Apr. 25, 2003, which is a Continuation Application of U.S. application Ser. No. 10/020,940, filed Dec. 19, 2001, now U.S. Pat. No. 6,573,583, both of which are based upon and claim the benefit of priority from the prior Japanese Patent Application No. 2000-397293, filed Dec. 27, 2000, the entire contents of all of which are incorporated herein by reference.

BACKGROUND

1. Field of the Invention

In recent years, shrinking of a CMOS-type semiconductor device is being promoted in compliance with the request for the high-speed operation and the high-performance of the device. In accordance with progress in the shrinking, the scaling of the distance between the gate and the source/drain contact is required.

2. Description of the Related Art

The problems relating to the shrinking of the high-performance MOS transistor equipped with a silicide electrode will now be described.

FIG. 1A is a cross-sectional view showing the construction of a high-performance MOS transistor equipped with a silicide electrode. The MOS transistor shown in FIG. 1A comprises a Si substrate 101, a device isolation insulating film 102 of a shallow trench isolation (STI), a gate electrode formed of a polycrystalline silicon (polysilicon) film 106 formed on the Si substrate 101 with a gate insulating film 105 interposed therebetween, a shallow source/drain diffusion layer 107 formed by ion implantation with the gate electrode used as a mask, a gate side-wall insulating film 109 formed on the side-wall of the gate electrode, a deep source/drain diffusion layer 111 of a high impurity concentration formed by ion implantation with the gate electrode equipped with the gate side-wall insulating film 109 used as a mask, and a metal silicide layer 112 such as a cobalt silicide layer formed on the exposed surface of the deep source/drain diffusion layer 111 of a high impurity concentration and on the gate electrode formed of the polysilicon layer 106. A mark $S_1$ shown in FIG. 1A denotes the length showing the expansion in the direction of the gate length of the metal silicide film covering the deep source/drain diffusion layer 111 of a high impurity concentration.

In shrinking the semiconductor device, it is absolutely necessary to decrease the width of the gate side-wall insulating film 109 in accordance with the scaling. Also, it is necessary to increase to some extent the depth of the deep source/drain diffusion layer 111 of a high impurity concentration in view of the generation of the leakage current in the junction surface between the deep source/drain diffusion layer 111 of a high impurity concentration having the silicided surface and the Si substrate 101. If the width of the gate side-wall insulating film 109 is decreased in this case, it is impossible to suppress the short-channel effect produced by the deep source/drain diffusion layer 111 of a high impurity concentration, with the result that it is difficult to shrink the width of the gate side-wall by the scaling in the high-performance MOS transistor equipped with a silicide electrode.

On the other hand, if the distance $S_1$ between the edge of the gate side-wall insulating film 109 and the peripheral portion on the side of the source/drain of the device isolation insulating film 102 of STI is decreased by the scaling, the area of the metal silicide layer formed on the deep source/drain diffusion layer of a high impurity concentration is decreased so as to increase the parasitic resistance. Particularly, in the case of using the MOS transistor structure of a corner contact type, in which a contact hole is formed in the corner portion of the source/drain forming region, the increase in the parasitic resistance constitutes a serious problem.

In conjunction with the problem described above, the method of forming a contact hole for connecting the source/drain regions of a high-performance MOS transistor equipped with a silicide electrode to the wiring on the semiconductor substrate and the problems accompanying the forming method will now be described in detail with reference to FIG. 1B.

FIG. 1B is a cross-sectional view showing the step of forming a contact hole in a high-performance MOS transistor equipped with a silicide electrode. As shown in the drawing, an interlayer insulating film 118 is formed to cover a high-performance MOS transistor equipped with silicide electrodes isolated from each other by the device isolation insulating film 102 of STI, followed by forming a contact hole 119 in the interlayer insulating film 118 by aligning a mask with the metal silicide layer 112 on the deep source/drain diffusion layer of a high impurity concentration by using a resist (not shown) and lithography.

In this case, if the length $S_1$ shown in FIG. 1A is shrunk by the scaling, a mask misalignment is generated as shown in FIG. 1B, with the result that the contact hole 119 partly reaches the gate side-wall insulating film 109 so as to markedly decrease the distance $S_2$ corresponding to the contact area with the metal silicide layer 112.

The connection between the metal wiring (not shown) on the semiconductor substrate and the metal silicide layer 112 is achieved by burying a contact plug made of a metallic material in the contact hole 119. Therefore, if the distance $S_2$ is decreased, the parasitic resistance between the source and drain of the MOS transistor is increased so as to lower the operating speed.

Also, with progress in the development of the semiconductor device, it is necessary to make shallower not only the shallow source/drain diffusion layer 107 of the MOS transistor but also the deep source/drain diffusion layer 111 of a high impurity concentration. However, as described previously, if the source/drain diffusion layer 111 of a high impurity concentration is made shallower, the generation of the contact leakage in forming the silicide layer 112 and the increase in the power consumption of the CMOS circuit accompanying the generation of the contact leakage are brought about as new problems. As a measure for overcoming these problems, proposed is a MOS transistor of an elevated source/drain structure.

The MOS transistor of this type is constructed such that a single crystal Si or SiGe layer is formed selectively by means of an epitaxial growth on a source/drain diffusion region of a high impurity concentration, and the impurity concentration in the surface region of the Si substrate including the epitaxial growth layer is increased so as to make the high impurity concentration diffusion layer in the Si substrate substantially shallower.

In the case of using the elevated source/drain structure, the surface region of the single crystal Si or SiGe layer grown by the selective epitaxial method on the source/drain diffusion region is converted into a silicide region so as to make it possible to avoid the generation of the contact leakage current.

In applying the elevated source/drain structure, it is absolutely necessary in allowing the CMOS circuit to operate normally to ensure the device isolation characteristics of STI so as to prevent completely a single crystal Si or SiGe layer from growing on the upper surfaces of the device isolation insulating film 102 of STI and the gate side-wall insulating film 109 and to allow the epitaxial growth layer to be formed selectively only on the upper surface of the source/drain diffusion region.

However, in the STI having a small separation width, the buried state is rendered poor when the device isolation insulating film 102 is buried in the trench so as to generate a seam of the device isolation insulating film in the central portion of the trench width in the longitudinal direction of the trench, as described in, for example, Jpn. Pat. Appln. KOKAI Publication No. 58-143548 and Jpn. Pat. Appln. KOKAI Publication No. 1-151245. In this case, if the epitaxial growth layer is selectively formed on the source/drain diffusion region, Si or SiGe particles are generated in the central portion in the width direction of the STI with the portion of the seam providing the growth nucleus.

The failure generation of the device isolation characteristics in the elevated source/drain structure will now be described more in detail with reference to FIGS. 2A and 2B. FIG. 2A is a cross-sectional view showing the normal STI structure in the elevated source/drain structure. The device isolation insulating film 102 of STI shown in FIG. 2A is buried satisfactorily in the trench because the trench has a large width, with the result that a seam generation is not recognized in the central portion of the STI. It follows that, if an epitaxial growth layer 110 is selectively formed on the Si substrate 101, the epitaxial growth layer 110 is formed in the peripheral portion of the device isolation insulating film 102 in which the STI is contiguous to the Si substrate 101. However, since a Si layer is not grown in the central portion of the device isolation insulating film 102, good device isolation characteristics can be assured.

However, if the trench width is small as shown in FIG. 2B, a device isolation insulating film 116 fails to be buried satisfactorily in the trench, with the result that a seam 117 of the device isolation insulating film 116 is generated in the central portion of the trench width in the longitudinal direction of the trench. In the surface of the device isolation insulating film 116 in which is generated the seam 117, the surface selectivity with the surface of the Si substrate is lowered in the process of the epitaxial growth, with the result that Si or SiGe particles 110a are generated with the seam 117 providing the nucleus of the growth. As a result, the leakage current on the surface of the device isolation insulating film 116 is increased so as to lower the device isolation characteristics of the STI, leading to the occurrence of a short-circuit. Incidentally, the deep source/drain diffusion layer 111 of a high impurity concentration is omitted from each of FIGS. 2A and 2B so as to simplify the drawing.

As described above, the performance of the MOS transistor is improved in the prior art by utilizing the elevated source/drain structure. However, since it is difficult to shrink the gate side-wall insulating film by means of scaling, the area of the contact on the source/drain region is decreased so as to give rise to the problem that the connection to the wiring by the contact hole is rendered difficult.

It should also be noted that, in accordance with the shrinking of the STI, a seam is generated in the device isolation insulating film when the device isolation insulating film is buried in the trench, with the result that, if a Si or SiGe layer is formed by a selective epitaxial growth method on the source/drain diffusion layer, Si or SiGe particles are generated on the device isolation insulating film with the seam providing the nucleus of the growth so as to give rise to the problem that the device isolation characteristics of the STI are degraded.

Each of the embodiments of the present invention described below provides a semiconductor device that permits assuring the contact area on the source/drain region regardless of the shrinking of the transistor structure by the scaling and a method of manufacturing the particular semiconductor device. Each of the embodiments of the present invention also provides a semiconductor device that permits assuring a high surface selectivity between the surface of the device isolation insulating film buried in the STI and the surface of the substrate on the source/drain diffusion layer so as to make it possible to realize an elevated source/drain structure while maintaining good device isolation characteristics of the STI and a method of manufacturing the particular semiconductor device.

SUMMARY

A semiconductor device according to an embodiment of the present invention comprises a gate electrode formed on a semiconductor substrate, source/drain diffusion layers formed on both sides of the gate electrode, a gate side-wall insulating film having an L-shaped/reversed L-shaped cross-sectional shape covering the gate electrode side-wall on the side of the source/drain diffusion layer and a part of the upper surface of the semiconductor substrate in the vicinity of the gate electrode, and a semiconductor layer formed on the source/drain diffusion layer and extending to cover the gate side-wall insulating film covering a part of the upper surface of the semiconductor substrate in the vicinity of the gate electrode.

A semiconductor device according to another embodiment of the present invention comprises a buried device isolation region including a trench formed in an upper surface region of a semiconductor substrate, a first buried insulating film formed to extend along the inner wall of the trench in a manner to be buried in a lower portion of the trench to reach a predetermined depth from the open surface of the trench, and a second buried insulating film formed to cover the first buried insulating film in an upper portion of the trench.

Further, a method of manufacturing a semiconductor device according to still another embodiment of the present invention comprises forming a gate electrode on a semiconductor substrate with a gate insulating film interposed therebetween, forming a shallow source/drain diffusion layer in those regions of the semiconductor substrate which are positioned on both sides of the gate electrode by means of ion implantation performed with the gate electrode used as a mask, forming a first side-wall insulating film on the semiconductor substrate after formation of the shallow source/drain diffusion layers, forming a second side-wall insulating film on the first side-wall insulating film, etching back a laminate structure including the first side-wall insulating film and the second side-wall insulating film, removing the second side-wall insulating film remaining on the side-wall portion of the gate electrode so as to form an L-shaped/reversed L-shaped side-wall structure consisting of the first side-wall insulating film covering the gate electrode side-wall portion and a part of the upper surface of the semiconductor substrate in the vicinity of the gate electrode, forming a semiconductor layer thicker than the first side-wall insulating film on the semiconductor substrate by means of a selective epitaxial growth method so as to form an extending portion of the semiconductor layer on the first side-wall insulating film covering a part of the upper surface of the semiconductor substrate, and forming deep source/drain diffusion layers in those portions of the semiconductor substrate which are positioned on both sides of the gate electrode by means of ion implantation performed with the gate electrode equipped with the side-wall structure used as a mask.

BRIEF DESCRIPTION OF THE DRAWINGS

FIGS. 3A to 3E are cross-sectional views collectively showing a method of manufacturing a semiconductor device according to a first embodiment of the present invention;

FIG. 4 is a cross-sectional view showing the construction of the STI structure according to a second embodiment of the present invention.

DETAILED DESCRIPTION

Some embodiments of the present invention will now be described in detail with reference to the accompanying drawings.

First Embodiment

FIGS. 3A to 3E are cross-sectional views collectively showing the manufacturing process and the construction of a high-performance MOS transistor of an elevated source/drain structure constituting a semiconductor device according to a first embodiment of the present invention.

Figure 3A:
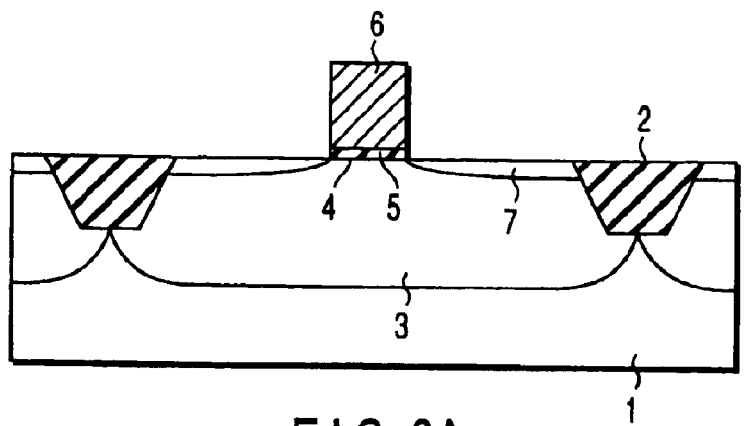

As shown in FIG. 3A, an STI is formed by burying a device isolation insulating film 2 in a shallow trench formed in a p-type or n-type Si substrate 1 in a depth of 200 to 350 nm. Then, an oxide film is formed in a thickness not larger than 20 nm on the surface of the Si substrate 1 in the active element forming region between the STI's shown in FIG. 3A, followed by forming a well region 3 and a channel region 4 by means of ion implantation of an impurity through the oxide film. Further, the implanted impurity is subjected to an activation heat treatment by utilizing a rapid thermal annealing (RTA).

Concerning the typical conditions of the ion implantation, phosphorus (P) is implanted into the n-well region 3 under an accelerating energy of 500 keV and at a dose amount of $3.0E13$ $cm^{-2}$. Boron (B) is implanted into the channel region 4 under an accelerating energy of 50 keV and at a dose amount of $1.5E13$ $cm^{-2}$. Boron (B) is implanted into a p-well under an accelerating energy of 260 keV and at a dose amount of $2.0E13$ $cm^{-2}$. Further, phosphorus (P) is implanted into the channel region within the p-well under an accelerating energy of 130 keV and at a dose amount of $1.5E13$ $cm^{-2}$.

Then, after removal of the oxide film on the surface of the substrate, a gate oxide film 5 is formed in a thickness of 1.5 to 6 nm by means of a thermal oxidation or a low-pressure chemical vapor deposition (LPCVD), followed by depositing a polysilicon layer in a thickness of 100 to 200 nm on the gate oxide film 5. Then, patterning of a gate electrode having a gate length of 20 to 150 nm is performed by employing a light, X-ray or electron-beam lithography, followed by an etching using a reactive ion etching (RIE) so as to form a gate electrode consisting of the polysilicon layer 6.

It is possible for the gate insulating film to be formed of SiON, SiN or a material having a high dielectric constant such as $Ta_2O_5$ in addition to the gate oxide film 5 made of $SiO_2$. It is also possible to employ in place of the polysilicon layer 6 a metal gate structure using, for example, tungsten (W) having a high conductivity as a material of the gate electrode with, for example, TiN or WN used as a barrier metal.

In the next step, a thermal oxide film having a thickness of 2 to 6 nm is formed as a post oxidation, followed by implanting impurity ions with the gate electrode used as a mask so as to form shallow source/drain diffusion layers 7 on both sides of the gate electrode. Further, an activation heat treatment of the implanted ions is performed by means of an RTA. Concerning the typical conditions of the ion implantation, arsenic (As) is implanted into an n-type shallow diffusion layer under an accelerating energy of 0.5 to 5.0 keV and at a dose amount of $5.0E14$ to $2.0E15$ $cm^{-2}$. Also, $BF_2$ or Boron is implanted into a p-type shallow diffusion layer under an acceleration energy of 0.2 to 3.0 keV and at a dose amount of $5.0E14$ to $2.0E15$ $cm^{-2}$.

Figure 3B:
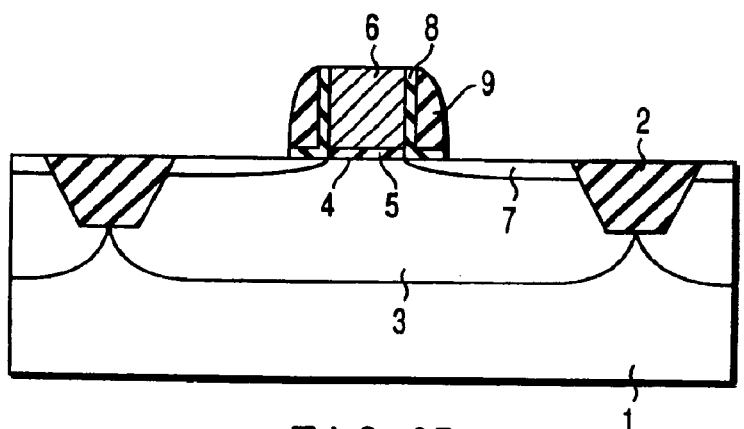

Then, after removal of the thermal oxide film by the post oxidation, a silicon nitride film 8 and a silicon oxide film 9 are deposited by the LPCVD method on the entire surface of the Si substrate 1 having the gate electrode formed thereon with the gate oxide film 5 interposed therebetween. Further, a laminate structure including the silicon nitride film 8 and the silicon oxide film 9 is etched back by RIE until the laminate structure positioned on the gate electrode and on the Si substrate 1 is removed, thereby forming a gate side-wall insulating film including the silicon nitride film 8 and the silicon oxide film 9, as shown in FIG. 3B. Incidentally, it is conceivable for a silicon oxide film to be formed below the silicon nitride film 8 as well as on the silicon nitride film 8.

In this case, the upper surface of the Si substrate 1 in the shallow source/drain diffusion layers 7 is exposed to the RIE treatment, with the result that a damaged layer or a carbon layer is mixed in the Si substrate. Therefore, in order to obtain the surface of the Si substrate 1 free from damage, the surface of the Si substrate 1 is oxidized by means of an $O_2$ RIE, followed by removing the oxidized surface layer with diluted hydrofluoric acid.

Figure 3C:
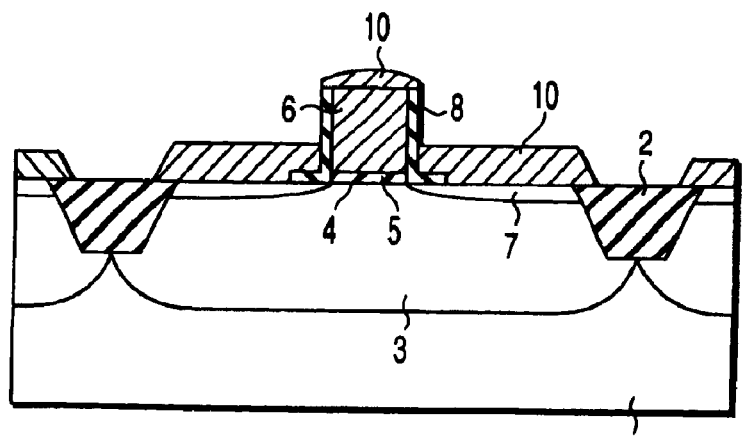

In the next step, the silicon oxide film 9 covering the silicon nitride film 8 is removed by using diluted hydrofluoric acid so as to form a gate side-wall insulating film consisting of the silicon nitride film 8 having an L-shaped and a reversed L-shaped cross-sectional shape as shown in FIG. 3C. Then, a heat treatment is performed at a high temperature under a hydrogen gas atmosphere so as to remove the native oxide film, thereby selectively forming a Si or SiGe layer 10 by the epitaxial growth on the exposed surface of the Si substrate 1 on the shallow source/drain diffusion layers 7.

The process of the epitaxial growth is performed by heating the Si substrate, etc., under a hydrogen gas atmosphere at a high temperature not lower than 800° C., and supplying a source gas such as $SiH_4$, $SiH_2Cl_2$ or $SiHCl_3$ onto the Si substrate together with hydrogen gas. Alternatively, a source gas such as $GeH_2$, $GeH_2Cl_2$ or $GeHCl_3$ is supplied onto the Si substrate together with hydrogen gas under a hydrogen gas atmosphere of about 650° C. so as to permit a Si or SiGe layer 10 to grow selectively on the surface of the Si substrate 1 exposed on the shallow source/drain diffusion layers 7 or only on the surface of the polysilicon layer 6 exposed on the upper surface of the gate electrode.

In this case, it is possible to cap the gate electrode formed of the polysilicon film 6 with an insulating film so as to prevent the Si or SiGe layer 10 from growing on the gate electrode and to allow the Si or SiGe layer 10 to grow selectively only on the upper surfaces of the shallow source/drain layers 7. The apparatus used for the selective epitaxial growth of the Si or SiGe layer 10 includes a vertical type, a barrel type and a cluster type. The heating method includes resistance heating, high-frequency heating, and lamp heating. Further, the wafer processing scheme can be classified into a one-wafer scheme and a wafer batch scheme. Any of these techniques can be employed for the epitaxial growth in the present invention.

In the first embodiment of the present invention, the thickness of the Si or SiGe layer 10 grown on the upper surface of the shallow source/drain diffusion layers 7 is set larger than the thickness of the gate side-wall insulating film formed of the silicon nitride film 8 as shown in FIG. 3C so as to allow the Si or SiGe layer 10 to cover the upper surface of the L-shaped or reversed L-shaped silicon nitride film 8 covering a part of the upper surface of the Si substrate in the vicinity of the gate electrode formed of the polysilicon layer 6. In this case, the Si or SiGe layer 10 also grows to cover the peripheral region of the device isolation insulating film 2 buried in the STI, with the result that it is possible to increase the area of the forming region of the Si or SiGe layer 10.

In the next step, if there is a capping layer above the gate electrode, the etching of this layer is performed, and a source/drain diffusion layer 11 having a high impurity concentration is formed by means of ion implantation through the Si or SiGe layer 10 with the gate electrode provided with the gate side-wall insulating film formed of the silicon nitride film 8 used as a mask so as to form an elevated source/drain structure, as shown in FIG. 3D. Incidentally, the order of the manufacturing steps described above is no more than an example. For example, it is possible to form first the source/drain diffusion layer of a high impurity concentration, followed by growing the Si or SiGe layer 10. The present invention is not necessarily limited to the order of the manufacturing steps described above.

In order to suppress the short channel effect of the MOS transistor, it is desirable for the relationship described below to be established between the depth of the source/drain diffusion layer of a high impurity concentration and the size in the vicinity of the gate electrode masked by the gate side-wall insulating film.

Specifically, the gate side-wall insulating films formed of the L-shaped and reversed L-shaped silicon nitride film 8 are formed to cover partly the upper surface of the semiconductor substrate (upper surfaces of the source/drain regions) in the vicinity of the gate electrode. In the present invention, the length SW, in the direction of the gate length, of the upper surface of the semiconductor substrate covered with the gate side-wall insulating film (length of the lower side of the L-shape of the gate side-wall insulating film) is set to fall within a range of $Xj \times 0.4 \leq SW \leq Xj \times 0.8$, where Xj represents the junction depth of the source/drain diffusion layer 11 of a high impurity concentration.

In the next step, a metal silicide layer 12 is formed in a self-aligned manner. For example, a metal film consisting of, for example, Ti, Co or Ni is formed on the entire surface, followed by applying heat treatment so as to convert the upper region of the silicon layer into the metal silicide layer 12. Then, the unreacted metal layer is removed so as to obtain a MOS transistor of an elevated source/drain structure having a small series resistance in the electrode portion.

It is also possible to form a poly-metal structure on the gate electrode in place of the metal silicide layer 12 in order to further decrease the gate resistance. For forming the poly-metal structure, a barrier metal layer of a TiN layer or a WN layer is formed directly on the polysilicon layer 6, followed by depositing a W layer having a high conductivity on the barrier metal layer. Also, it is conceivable for the gate electrode to be formed of polycrystalline silicon germanium (poly-SiGe).

In the next step, TEOS, BPSG, SiN, or the like is deposited to form an interlayer insulating film (not shown), followed by planarizing the surface of the interlayer insulating film by means of CMP. Then, a contact hole is formed in conformity with the silicide layer 12 of the source/drain region by using a resist mask and the RIE method, followed by forming a barrier metal layer of, for example, Ti or TiN on the inner wall of the contact hole. Further, W is blanketed or selectively grown in a manner to fill the contact hole, followed by applying a CMP treatment to the formed W layer so as to form a contact plug serving to connect the wiring to the source/drain regions. Finally, after deposition of a metal for the wiring, the wiring is patterned so as to finish the manufacture of a high-performance semiconductor device according to the first embodiment of the present invention.

In the semiconductor device according to the first embodiment of the present invention, the epitaxially grown layer, which is converted into a metal silicide layer to form the source/drain electrode, has a large area even if the MOS transistor is miniaturized so as to make it possible to increase the mask alignment margin of the contact hole connected to the wiring and, thus, to provide easily a semiconductor device having a low parasitic resistance.

Incidentally, in the description given above, the Si or SiGe layer 10 is converted into a single crystal on the substrate 1 exposed to the source/drain region. However, the Si or SiGe layer 10 is not necessarily converted into a single crystal on the silicon nitride film 8, the device isolation insulating film 2 and the polysilicon layer 6, but possibly remains to be polycrystalline. In the first embodiment of the present invention, no particular problem is generated even if the Si or SiGe layer 10 is partly converted into a polycrystalline state.

Second Embodiment

The STI structure of a semiconductor device according to a second embodiment of the present invention and the manufacturing method thereof will now be described with reference to FIGS. 4 and 5A to 5F.

FIG. 4 is a cross-sectional view showing the construction of the device isolation insulating film buried in the STI and the peripheral portion thereof. The construction shown in FIG. 4 comprises a Si substrate 1, a gate electrode including a polysilicon layer 6, etc., a gate side-wall insulating film formed of, for example, a silicon oxide film 9, a Si or SiGe layer 10 formed on the source/drain region (not shown) and the gate electrode, a first device isolation insulating film 16 buried in the bottom portion of a trench forming the STI, a seam 17 generated inside the first device isolation insulating film 16 within the trench, and a second device isolation insulating film 18 buried in an upper portion of the opening of the trench and not containing a seam. Incidentally, it is possible for the first device isolation insulating film 16 not to include a seam depending on the separation width of the STI and the etching amount of the first device isolation film 16.

The second embodiment is directed to the construction of the first and second device isolation insulating films 16, 18 buried in the STI and the surface selectivity of the STI surface in the step of the epitaxial growth of the Si or SiGe layer 10 on the surface of the Si substrate. Such being the situation, the construction of the transistor separated by the STI is shown in a simplified manner for avoiding the complexity of the drawing.

Figure 1A:
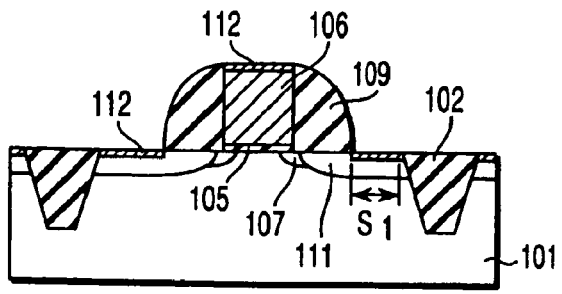
FIGS. 1A and 1B are cross-sectional views collectively showing the construction of and the problem inherent in an elevated source/drain MOS transistor.
Figure 1B:
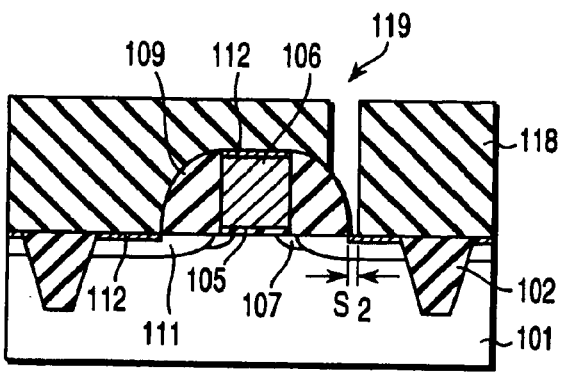
Figure 2A:
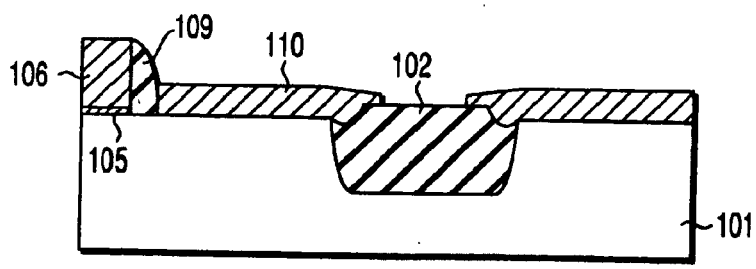
FIGS. 2A and 2B are cross-sectional views collectively showing the construction of and the problem inherent in the STI structure.
Figure 2B:
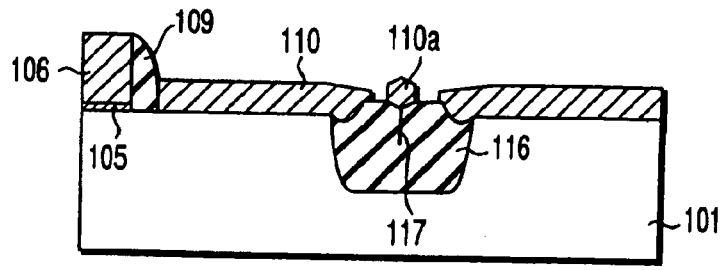

As described previously in conjunction with FIG. 2B, a seam of the device isolation insulating film is generated in the central portion of the separation width in the longitudinal direction of the STI if the separation width of the STI is decreased in accordance with the miniaturization, with the result that Si or SiGe particles are generated with the seam providing the nucleus of the growth. As a result, the device isolation characteristics are rendered poor. In the STI according to the second embodiment of the present invention, however, the open portion of the trench is covered with the flat second device isolation insulating film 18 that does not include a seam, as shown in FIG. 4. As a result, in the epitaxial growth of the Si or SiGe layer 10, the epitaxial layer is grown from the surface of the Si substrate 1 in a manner to overhang the peripheral portion of the opening of the trench. However, a crystal grain is not generated in the central portion of the separation width. It follows that it is possible to assure good separation characteristics of the STI.

The manufacturing method of the STI according to the second embodiment of the present invention will now be described with reference to FIGS. 5A to 5F.

In the first step, a silicon oxide film (not shown) having a thickness of 6 to 10 nm is formed on a p-type or n-type Si substrate 1, followed by forming a silicon nitride film 13 having a thickness of 100 to 150 nm by using an LPCVD method and subsequently forming a silicon oxide film 14 having a thickness of 100 to 150 nm on the silicon nitride film 13.

In the next step, a trench 15 of STI is formed by using and optical lithography and a RIE etching, followed by forming a surface oxide film having a thickness of 13 to 15 nm under an atmosphere of oxygen and nitrogen at 1,000° C. By this surface oxidation, the edge portion of the STI structure is rendered roundish so as to produce the effect of moderating the electric field concentration in the edge portion during operation of the semiconductor device.

Figure 5A:
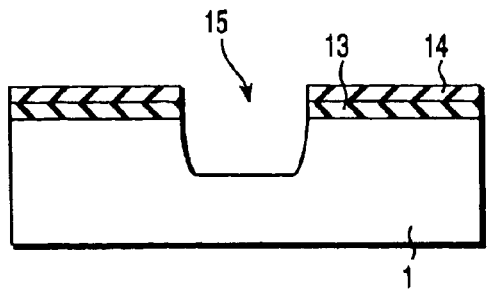
FIGS. 5A to 5F are cross-sectional views collectively showing a method of manufacturing an STI according to the second embodiment of the present invention.
Figure 5B:
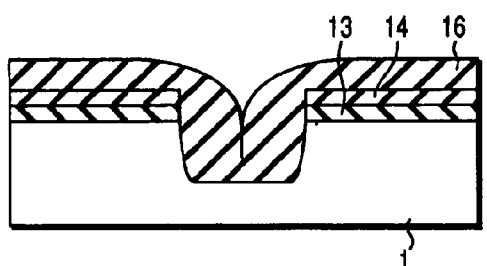

In the next step, a first device isolation insulating film 16 made of, for example, $SiO_2$ or $O_3$-TEOS is formed by the LPCVD or PECVD (Plasma Enhanced Chemical Vapor Deposition) in a manner to cover the trench 15, as shown in FIG. 5B. In this case, if the opening width of the trench 15 is decreased because of the miniaturization of the semiconductor device so as to increase the aspect ratio, which is a ratio of the depth to the opening width of the trench 15, the surfaces of the first device isolation insulating film 16 grown from the inner wall of the trench 15 are brought into mutual contact in the center of the separation width. It follows that the first device isolation insulating film is deposited in a manner to be seemingly folded inside the trench 15.

Figure 5C:
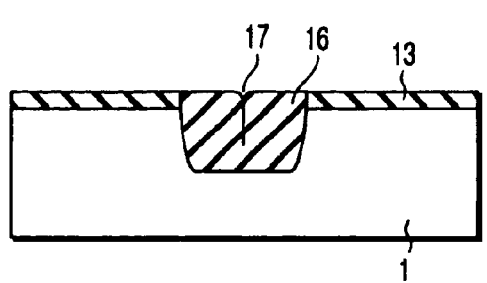

Further, the surface is planarized by the chemical mechanical polishing (CMP) method and, then, the silicon oxide film 14 is removed by a wet etching method as shown in FIG. 5C. It should be noted that the contacted portion of the surfaces generated in the first device isolation insulating film 16 in the step shown in FIG. 5B cannot be removed by the planarizing and removing steps so as to remain as a seam 17 in the central portion of the first device isolation insulating film 16 buried in the trench 15, as shown in FIG. 5C. The seam 17 is rendered prominent particularly when the separation width of the STI is small.

As described previously, the seam 17 forms the nucleus of growth of the Si or SiGe particles in the selective epitaxial growing step of the Si or SiGe layer 10 so as to cause the selectivity degradation. Therefore, the following treatment is applied so as to prevent the seam 17 from appearing on the surface of the device isolation insulating film.

Figure 5D:
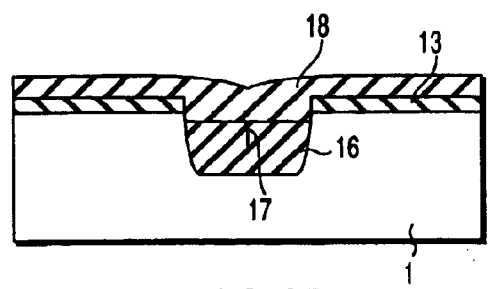

Specifically, the surface of the first device isolation insulating film 16 made of, for example, $SiO_2$ or $O_3$-TEOS, which is once buried in the trench 15, is etched with a diluted hydrofluoric acid so as to decrease the thickness of the first device isolation insulating film 16 by about 100 nm. It is also possible to employ a RIE method for the etching of the surface of the first device isolation insulating film 16. Then, the groove formed in the open portion of the trench 15 by the etching (reduction in the thickness) of the surface region of the first device isolation insulating film 16 is covered with a second device isolation insulating film 18 made of $SiO_2$ or $O_3$-TEOS, as shown in FIG. 5D. In this case, the aspect ratio of the groove is smaller than the aspect ratio of the trench 15 shown in FIG. 5A so as to achieve a good buried state of the second device isolation insulating film 18 in the groove, though the separation width of the STI is small.

As described above, if the depth of the groove formed in the open portion is made smaller than the minimum diameter (separation width of the STI) of the open portion of the trench by allowing the surface of the first device isolation insulating film 16 to retreat from the open surface of the trench, the second device isolation insulating film 18 can be buried in the groove in a good buried state. It follows that it is possible to prevent the second device isolation insulating film 18 buried in the groove from including a seam in the central portion relative to the kinds and qualities of many insulating films and the growing conditions.

Figure 5E:
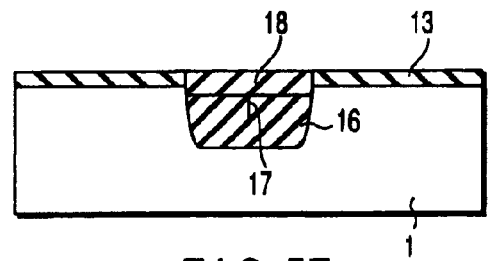
Figure 5F:
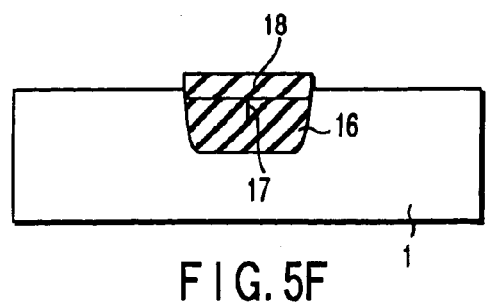

In the next step, a CMP treatment is applied with the silicon nitride film 13 used as a stopper so as to planarize the surface of the second device isolation insulating film 18, with the result that the seam 17 does not appear on the surface, as shown in FIG. 5E. Finally, the silicon nitride film 13 is removed by etching so as to form the STI structure in which the seam 17 is not present on the surface, as shown in FIG. 5F. Then, if a semiconductor device comprising the CMOS circuit is formed by the manufacturing process described previously in conjunction with the first embodiment, it is possible to avoid the defective device isolation characteristics caused by the selectivity degradation in the selective epitaxial growth process of the Si or SiGe layer required for the formation of the elevated source/drain structure.

The present invention is not limited to the embodiments described above. For example, it is possible to allow the first device isolation insulating film to retreat until the seam generated inside the first device isolation insulating film does not remain in the first device isolation insulating film in the second embodiment of the present invention. In this case, the STI structure is equal to that shown in FIG. 4, except that the seam inside the first device isolation insulating film is removed. However, if the aspect ratio of the groove is decreased to such an extent that the seam does not appear on the surface of the second device isolation insulating film in burying the second device isolation insulating film in the trench above the first device isolation insulating film, no particular problem is generated in the device isolation characteristics of the resultant STI structure.

As described above, according to the semiconductor device of the present invention, it is possible to ensure the contact area on the source/drain region regardless of the miniaturization of the transistor structure caused by the scaling, with the result that the connection to the wiring via the contact hole is facilitated so as to decrease the series resistance of the MOS transistor. Also, it is possible to ensure a high surface selectivity between the surface of the device isolation insulating film and the substrate surface on the source/drain diffusion layer regardless of the miniaturization of the STI structure so as to make it possible to provide a semiconductor device formed of a high-performance MOS transistor having satisfactory device isolation characteristics.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a gate electrode on a semiconductor substrate with a gate insulating film interposed therebetween;

forming shallow source/drain diffusion layer in those regions of said semiconductor substrate which are positioned on both sides of said gate electrode by means of ion implantation performed with said gate electrode used as a mask;

forming a first side-wall insulating film on said semiconductor substrate after formation of said shallow source/drain diffusion layers;

forming a second side-wall insulating film on said first side-wall insulating film;

etching back a laminate structure including said first side-wall insulating film and said second side-wall insulating film;

removing said second side-wall insulating film remaining on the side-wall portion of said gate electrode so as to form an L-shaped/reversed L-shaped side-wall structure consisting of said first side-wall insulating film covering said gate electrode side-wall portion and a part of the upper surface of said semiconductor substrate in the vicinity of said gate electrode;

forming a semiconductor layer thicker than said first side-wall insulating film on said semiconductor substrate by means of a selective epitaxial growth method so as to form an extending portion of said semiconductor layer on said first side-wall insulating film covering a part of the upper surface of said semiconductor substrate; and forming deep source/drain diffusion layers in those portions of said semiconductor substrate which are positioned on both sides of said gate electrode by means of ion implantation performed with said gate electrode equipped with the side-wall structure used as a mask.

2. A method of manufacturing a semiconductor device according to claim 1, further comprising forming a buried device isolation region consisting of a trench having an insulating film buried therein and positioned contiguous to the outer peripheral portion of said deep source/drain diffusion layers, wherein the process of forming said buried device isolation region comprises:

forming a trench in a semiconductor substrate;

burying a first insulating film having a seam in a central portion of said trench width along the inner wall of said trench;

removing said first insulating film deposited outside said trench so as to planarize the surface of said semiconductor substrate;

etching said first insulating film so as to allow the surface of said insulating film to further retreat;

burying a second insulating film in a manner to cover said first insulating film remaining in the bottom portion of said trench; and removing that portion of said second insulating film which is deposited outside said trench.

* * * * *